(12) United States Patent
Hsiao et al.

(10) Patent No.: US 11,476,351 B2
(45) Date of Patent: Oct. 18, 2022

(54) METAL GATE STRUCTURES AND METHODS OF FABRICATING THE SAME IN FIELD-EFFECT TRANSISTORS

(71) Applicant: Taiwan Semiconductor Manufacturing Co., Ltd., Hsin-Chu (TW)

(72) Inventors: Ru-Shang Hsiao, Hsinchu County (TW); Ching-Hwanq Su, Tainan (TW); Pin Chia Su, Tainan County (TW); Ying Hsin Lu, Tainan (TW); I-Shan Huang, Tainan (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 34 days.

(21) Appl. No.: 16/943,687

(22) Filed: Jul. 30, 2020

(65) Prior Publication Data
US 2021/0257481 A1 Aug. 19, 2021

Related U.S. Application Data

(60) Provisional application No. 62/977,912, filed on Feb. 18, 2020.

(51) Int. Cl.
*H01L 31/062* (2012.01)
*H01L 31/113* (2006.01)
(Continued)

(52) U.S. Cl.
CPC ............ *H01L 29/66795* (2013.01); *H01L 21/823431* (2013.01); *H01L 29/66545* (2013.01); *H01L 29/7851* (2013.01)

(58) Field of Classification Search
CPC ....... H01L 29/66795; H01L 21/823431; H01L 29/66545; H01L 29/7851; H01L 29/785;
(Continued)

(56) References Cited

U.S. PATENT DOCUMENTS

2005/0142767 A1 6/2005 Jin
2010/0044783 A1 2/2010 Chuang et al.
(Continued)

FOREIGN PATENT DOCUMENTS

KR 20050064787 A 6/2005
KR 20180013683 A 2/2018
(Continued)

*Primary Examiner* — Theresa T Doan
(74) *Attorney, Agent, or Firm* — Haynes and Boone, LLP

(57) ABSTRACT

A method includes forming a dummy gate stack over a fin protruding from a semiconductor substrate, forming gate spacers on sidewalls of the dummy gate stack, forming source/features over portions of the fin, forming a gate trench between the gate spacers, which includes trimming top portions of the gate spacers to form a funnel-like opening in the gate trench, and forming a metal gate structure in the gate trench. A semiconductor structure includes a fin protruding from a substrate, a metal gate structure disposed over the fin, gate spacers disposed on sidewalls of the metal gate structure, where a top surface of each gate spacer is angled toward the semiconductor fin, a dielectric layer disposed over the top surface of each gate spacer, and a conductive feature disposed between the gate spacers to contact the metal gate structure, where sidewalls of the conductive feature contact the dielectric layer.

20 Claims, 14 Drawing Sheets

(51) Int. Cl.
*H01L 29/66* (2006.01)
*H01L 21/8234* (2006.01)
*H01L 29/78* (2006.01)

(58) Field of Classification Search
CPC ............ H01L 29/7855; H01L 29/0603; H01L 29/0684; H01L 29/42356; H01L 29/66477
USPC ........................................................ 257/401
See application file for complete search history.

(56) References Cited

U.S. PATENT DOCUMENTS

| | | | |
|---|---|---|---|
| 2015/0364473 A1* | 12/2015 | Kim | ...................... H01L 27/092 257/369 |
| 2016/0049488 A1 | 2/2016 | Shen et al. | |
| 2016/0240624 A1 | 8/2016 | Zhu | |

FOREIGN PATENT DOCUMENTS

| | | |
|---|---|---|
| TW | 201123276 A | 7/2011 |
| TW | 201824447 A | 7/2018 |

\* cited by examiner

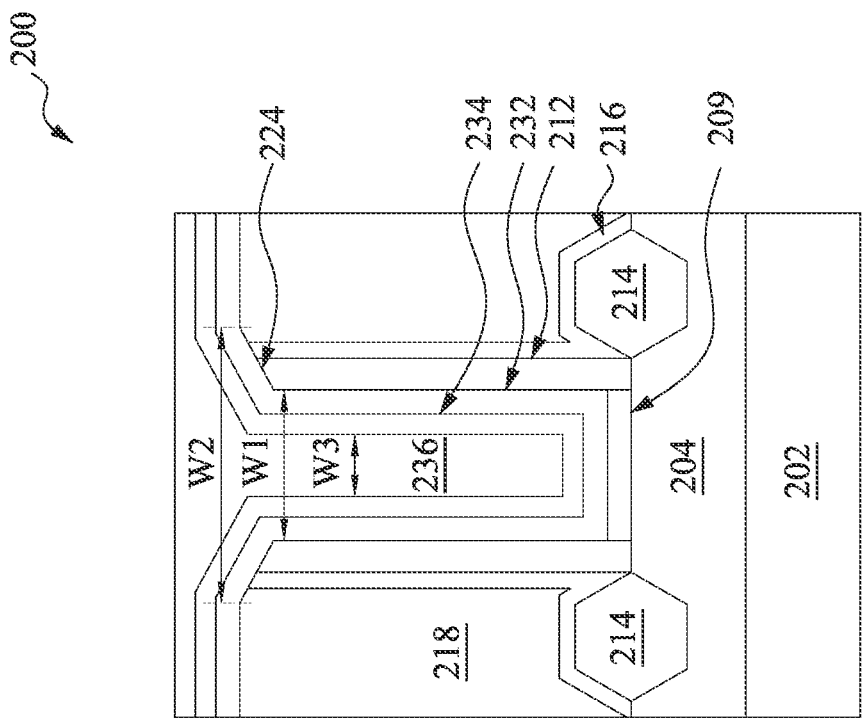
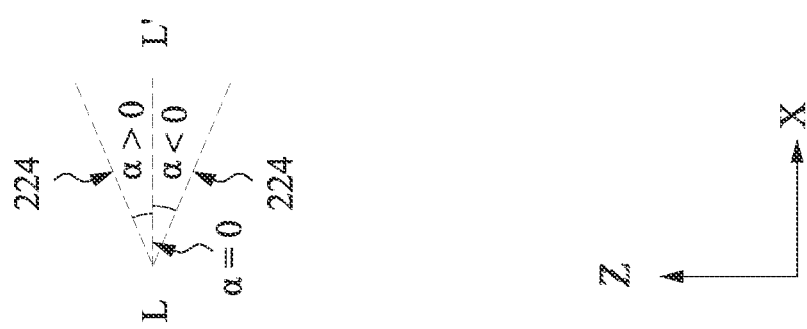
FIG. 10

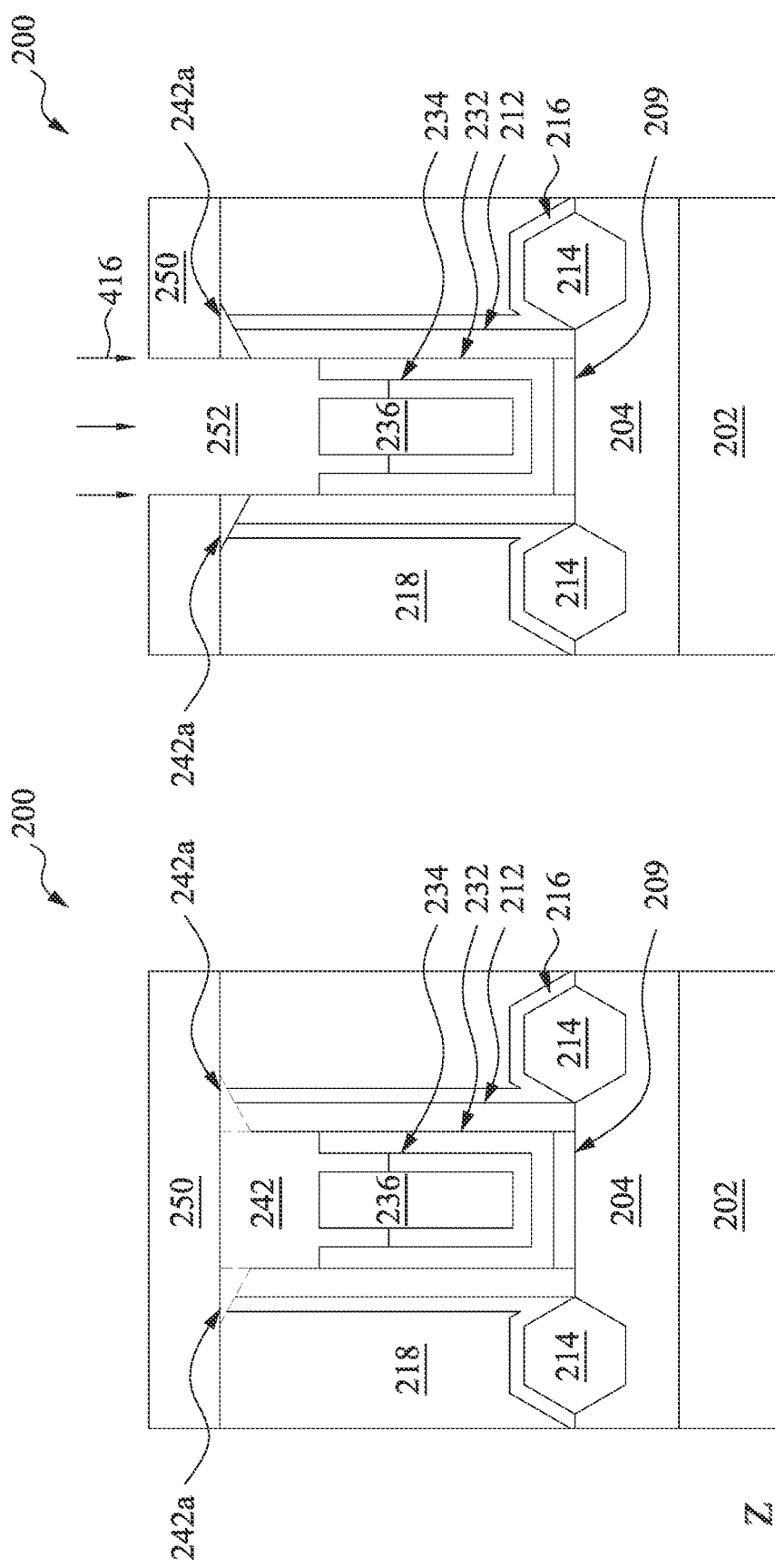

METAL GATE STRUCTURES AND METHODS OF FABRICATING THE SAME IN FIELD-EFFECT TRANSISTORS

CROSS-REFERENCE TO RELATED APPLICATIONS

This is a non-provisional application of and claims priority to U.S. Provisional Patent Application Ser. No. 62/977,912, filed Feb. 18, 2020, the entire disclosure of which is incorporated herein by reference.

BACKGROUND

The semiconductor industry has experienced rapid growth. Technological advances in semiconductor materials and design have produced generations of semiconductor devices where each generation has smaller and more complex circuits than the previous generation. In the course of integrated circuit (IC) evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. But these advances have also increased the complexity of processing and manufacturing semiconductor devices.

As feature sizes continue to decrease, challenges arise when forming metal gate stacks with multiple material layers in field-effect transistors (FETs). For example, during a gate replacement process, after forming at least a gate dielectric layer and a work function metal layer in a gate trench, the remaining space of the gate trench available for a bulk conductive layer is inevitably limited and may cause difficulty in the deposition of the bulk conductive layer. For at least this reason, improvements in methods of forming metal gate stacks are desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3, 4, 5, 6, 7, 8, 9, 10, 11, 12A, 12B, 13, 14, 15, 16, 17, 18A, and 18B are cross-sectional views of the semiconductor device taken along line AA' as shown in FIGS. 2A and/or 2B, in portion or in entirety, during intermediate stages of the method shown in FIGS. 1A and/or 1B according to various embodiments of the present disclosure.

DETAILED DESCRIPTION

Figure 1A:
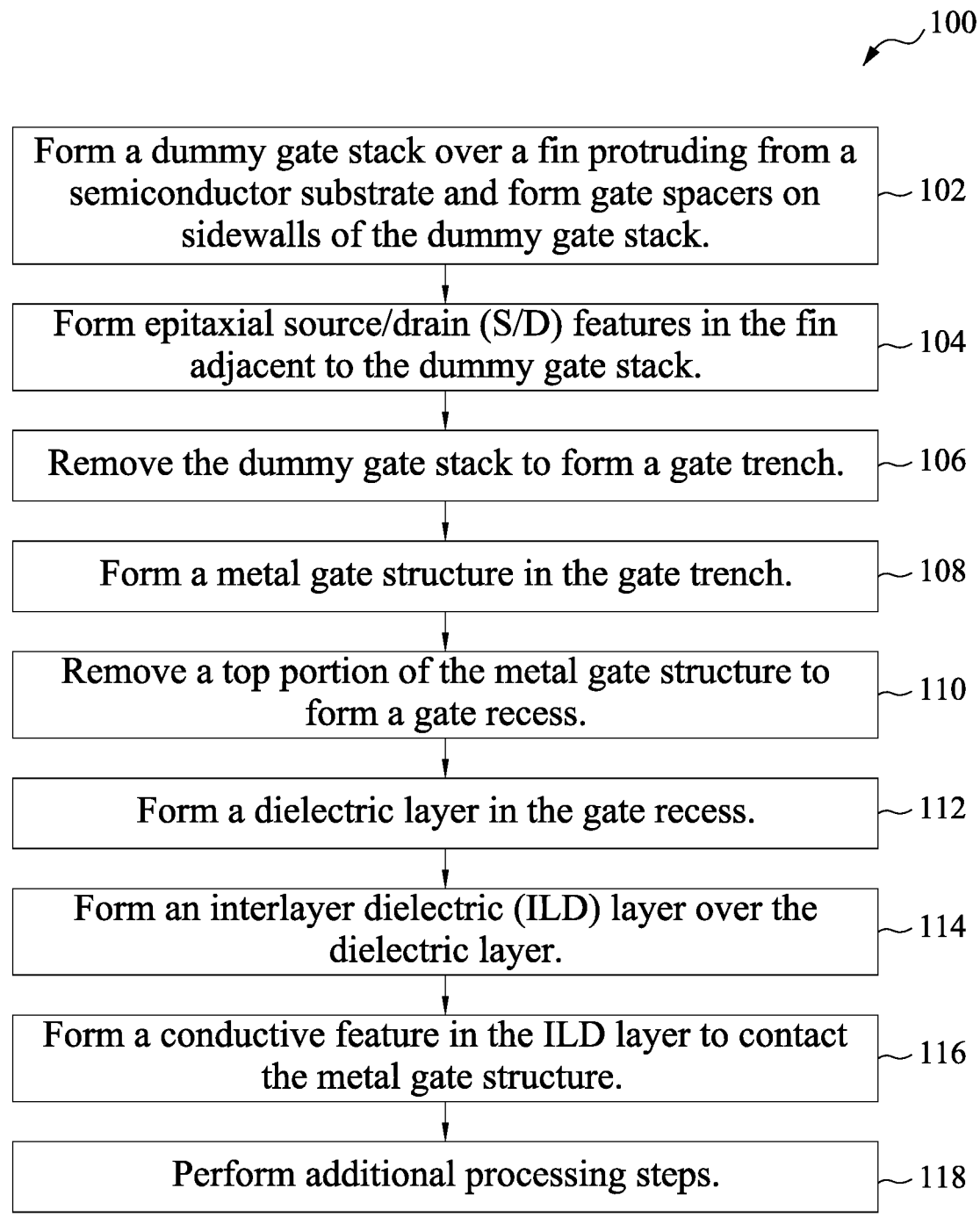
FIGS. 1A and 1B illustrate a flowchart of an example method for fabricating a semiconductor device according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Furthermore, when a number or a range of numbers is described with "about," "approximate," and the like, the term is intended to encompass numbers that are within a reasonable range including the number described, such as within +/−10% of the number described or other values as understood by person skilled in the art. For example, the term "about 5 nm" encompasses the dimension range from 4.5 nm to 5.5 nm. Still further, the present disclosure may repeat reference numerals and/or letters in the various examples. This repetition is for the purpose of simplicity and clarity and does not in itself dictate a relationship between the various embodiments and/or configurations discussed.

The present disclosure is generally related to semiconductor devices, and more particularly to field-effect transistors (FETs), such as planar FETs, three-dimension fin FETs (FinFETs), three-dimensional gate-all-around (GAA) FETs, and/or other types of FETs.

The ever-decreasing feature sizes in FETs pose many challenges to the IC fabrication process. For example, reducing gate length while maintaining desired functions of a metal gate stack may lead to limited processing window (e.g., available space for deposition) for various material layers in the metal gate stack. In some cases, such limited processing window may lead to inefficient and/or incomplete deposition of a material layer (e.g., a bulk conductive layer), potentially causing structural defects in the resulting FET. While existing technologies for addressing this and other issues have been generally adequate, they have not been entirely satisfactory in all aspects.

Figure 1B:
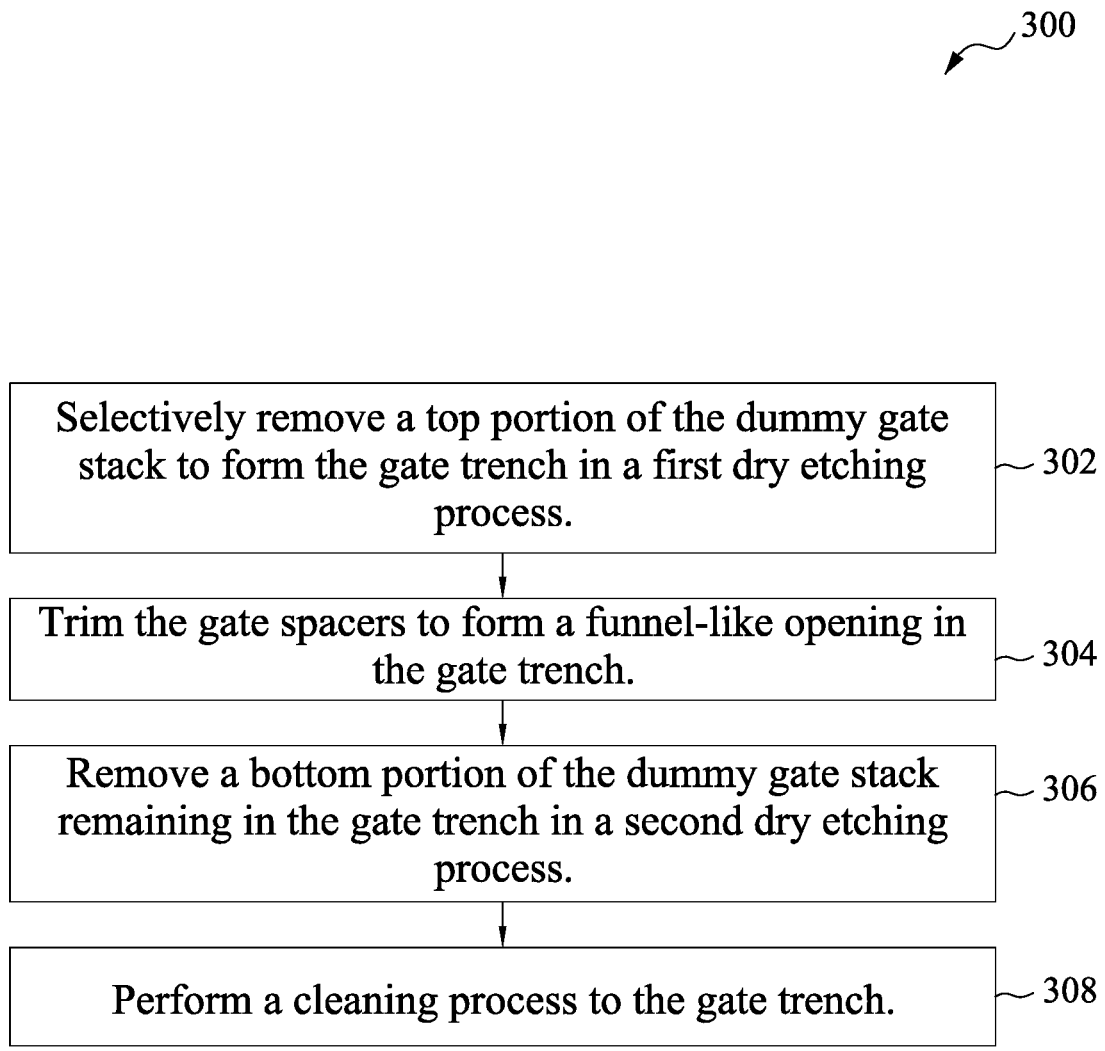

Referring now to FIGS. 1A and 1B, flowcharts of a method 100 and a method 300 of forming a semiconductor device 200 (hereafter simply referred to as the device 200) are illustrated according to various aspects of the present disclosure. Methods 100 and 300 are merely examples and are not intended to limit the present disclosure beyond what is explicitly recited in the claims. Additional operations can be provided before, during, and after methods 100 and 300, and some operations described can be replaced, eliminated, or moved around for additional embodiments of the method. Methods 100 and 300 are described below in conjunction with FIGS. 3-18B, which are cross-sectional views of the device 200 taken along the dashed line AA' shown in FIGS. 2A and 2B at intermediate steps of method 100. The device 200 may be an intermediate device fabricated during processing of an IC, or a portion thereof, that may comprise static random-access memory (SRAM) and/or other logic circuits, passive components such as resistors, capacitors, and inductors, and active components such as FinFETs, GAA FETs, metal-oxide semiconductor field effect transistors (MOSFETs), complementary metal-oxide semiconductor (CMOS) transistors, bipolar transistors, high voltage transistors, high frequency transistors, and/or other transistors. The present disclosure is not limited to any particular number of devices or device regions, or to any particular device configurations. For example, though the device 200 as illustrated is a three-dimensional device, the present disclosure may also provide embodiments for fabricating planar devices. Additional features can be added to the device 200, and some of the features described below can be replaced, modified, or eliminated in other embodiments of the device 200.

Figure 2B:
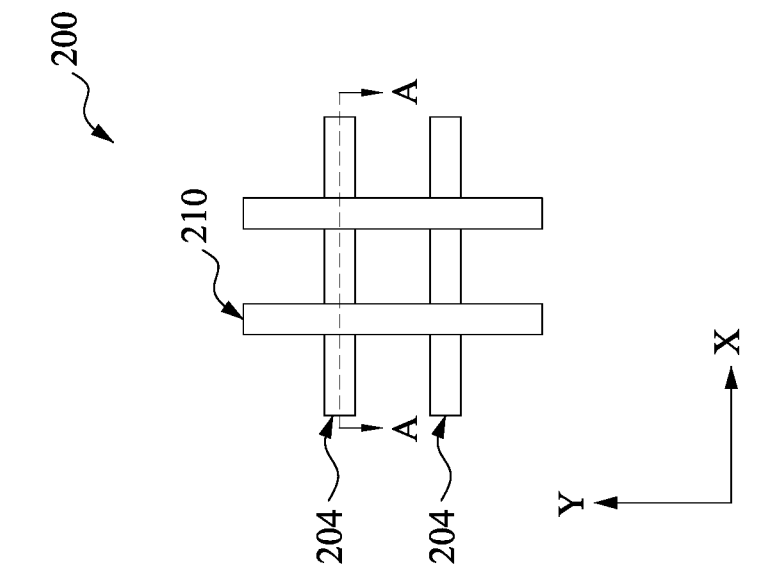
FIG. 2B is a planar top view of the semiconductor device shown in FIG. 2A according to various embodiments of the present disclosure.
Figure 2A:
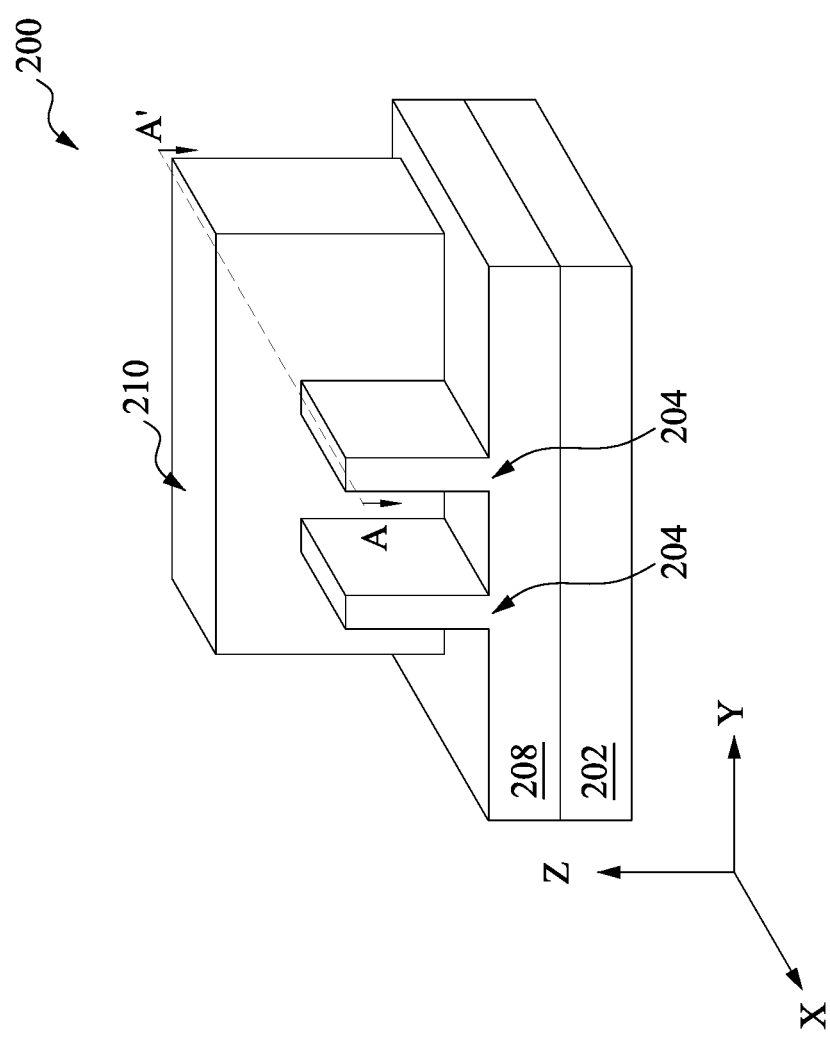
FIG. 2A is a three-dimensional perspective view of an example semiconductor device according to various embodiments of the present disclosure.
Figure 3:
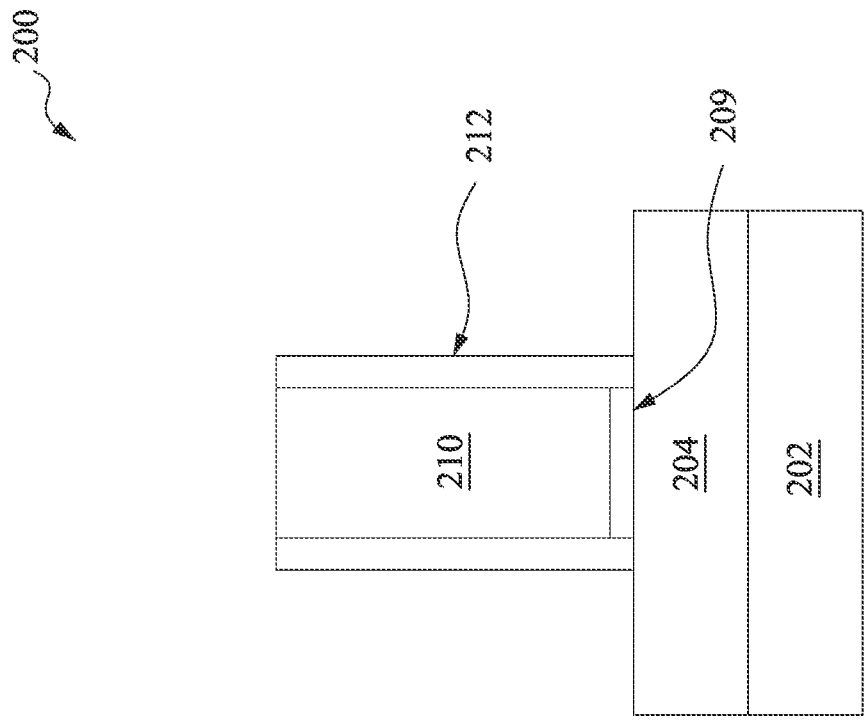
Figure 6:
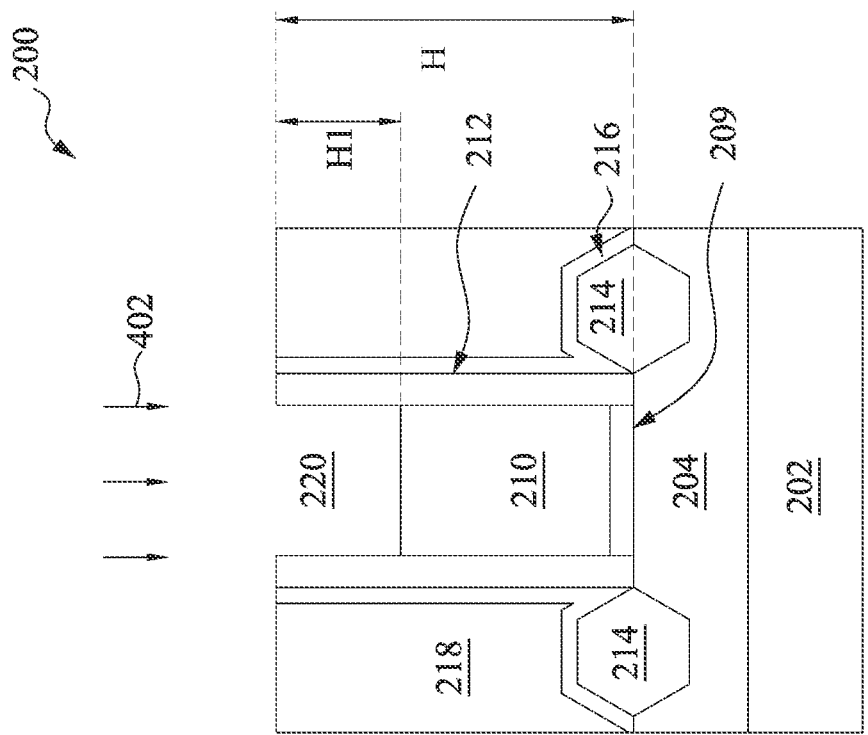
Figure 5:
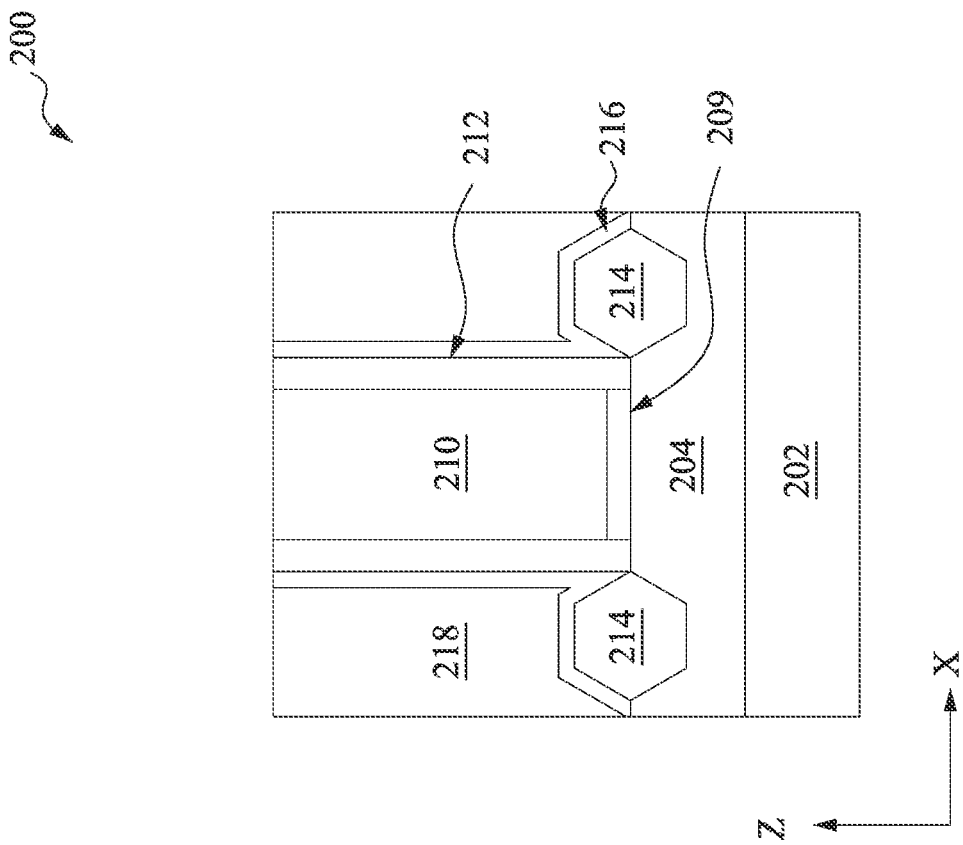

At operation 102, referring to FIGS. 2A, 2B, and 3, method 100 forms the device 200 that includes one or more fins (or active regions) 204 protruding from a substrate 202 and separated by isolation structures 208, a dummy gate stack (or a placeholder gate stack) 210 disposed over the fin 204, an interfacial layer 209 disposed between the dummy gate stack 210 and the fin 204, and gate spacers 212 disposed on sidewalls of the dummy gate stack 210. Though not depicted, the device 200 may include other components, such as hard mask layers, barrier layers, other suitable layers, or combinations thereof, disposed over the dummy gate stack 210.

The substrate 202 may include an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor, such as SiGe, GaAsP, AlInAs, AlGaAs, GaInAs, GaInP, GaInAsP, and/or other suitable materials. The substrate 202 may be a single-layer material having a uniform composition. Alternatively, the substrate 202 may include multiple material layers having similar or different compositions suitable for IC device manufacturing. In one example, the substrate 202 may be a silicon-on-insulator (SOI) substrate having a silicon layer formed on a silicon oxide layer. In another example, the substrate 202 may include a conductive layer, a semiconductor layer, a dielectric layer, other layers, or combinations thereof.

In some embodiments where the substrate 202 includes FETs, various doped regions are disposed in or on the substrate 202. The doped regions may be doped with n-type dopants, such as phosphorus or arsenic, and/or p-type dopants, such as boron or $BF_2$, depending on design requirements. The doped regions may be formed directly on the substrate 202, in a p-well structure, in an n-well structure, in a dual-well structure, or in a raised structure. Doped regions may be formed by implantation of dopant atoms, in-situ doped epitaxial growth, and/or other suitable techniques. Each fin 204 may be suitable for providing an n-type FET or a p-type FET. In some embodiments, the fins 204 as illustrated herein may be suitable for providing FETs of a similar type, i.e., both n-type or both p-type. Alternatively, they may be suitable for providing FETs of different types, i.e., an n-type and a p-type. This configuration is for illustrative purposes only and is not intended to be limiting.

The fins 204 may be fabricated using suitable processes including photolithography and etch processes. The photolithography process may include forming a photoresist layer (resist) overlying the substrate 202, exposing the resist to a pattern, performing post-exposure bake processes, and developing the resist to form a masking element (not shown) including the resist. The masking element is then used for etching recesses into the substrate 202, leaving the fins 204 on the substrate 202. The etching process may include dry etching, wet etching, reactive ion etching (RIE), and/or other suitable processes.

Numerous other embodiments of methods for forming the fins 204 may be suitable. For example, the fins 204 may be patterned using double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 204.

Referring to FIG. 2A, the isolation structures 208 may include silicon oxide, silicon nitride, silicon oxynitride, fluoride-doped silicate glass (FSG), a low-k dielectric material, and/or other suitable materials. The isolation structures 208 may include shallow trench isolation (STI) features. In one embodiment, the isolation structures 208 are formed by etching trenches in the substrate 202 during the formation of the fins 204. The trenches may then be filled with an isolating material described above by a deposition process, followed by a chemical mechanical planarization (CMP) process. In another embodiment, the isolation structures 208 are formed by depositing a dielectric layer as a spacer layer over the fins 204 and subsequently recessing the dielectric layer such that a top surface of the isolation structures 208 is below a top surface of the fins 204. Other isolation structure such as field oxide, local oxidation of silicon (LOCOS), and/or other suitable structures may also be implemented as the isolation structures 208. Alternatively, the isolation structures 208 may include a multi-layer structure, for example, having one or more thermal oxide liner layers. The isolation structures 208 may be deposited by any suitable method, such as chemical vapor deposition (CVD), flowable CVD (FCVD), spin-on-glass (SOG), other suitable methods, or combinations thereof.

Still referring to FIGS. 2A, 2B, and 3, the dummy gate stack 210 is disposed over the fins 204 and may include polysilicon. In the present embodiments, portions of the dummy gate stack 210 are replaced with metal gate stack after forming other components of the device 200. The dummy gate stack 210 may be formed by a series of deposition and patterning processes. For example, the dummy gate stack 210 may be formed by depositing a polysilicon layer over the fins 204 and performing an anisotropic etching process (e.g., a dry etching process) to remove portions of the polysilicon. In the present embodiments, the device 200 further includes the interfacial layer 209 comprising an oxide material, such as silicon oxide. The interfacial layer 209 may be formed on the fin 204 before depositing the polysilicon layer by a suitable method, such as thermal oxidation, chemical oxidation, other suitable methods, or combinations thereof. Portions of the interfacial layer 209 not covered by the dummy gate stack 210 may then be removed by a suitable etching process. In some embodiments (not depicted), the interfacial layer 209 is formed after removing the dummy gate stack 210 and before forming a metal gate stack (e.g., a high-k metal gate structure 230 discussed in detail below).

Thereafter, still referring to FIG. 3, the gate spacers 212 may be formed on the sidewalls of the dummy gate stack 210. The gate spacers 212 may be a single-layer structure or a multi-layer structure and may include silicon oxide, silicon nitride, silicon carbide, silicon oxynitride, silicon oxycarbide, other suitable materials, or combinations thereof. Each spacer layer of the gate spacers 212 may be formed by first depositing a dielectric layer over the dummy gate stack 210 and subsequently removing portions of the dielectric layer in an anisotropic etching process (e.g., a dry etching process), leaving portions of the dielectric layer on the sidewalls of the dummy gate stack 210 as the gate spacers 212.

Figure 4:
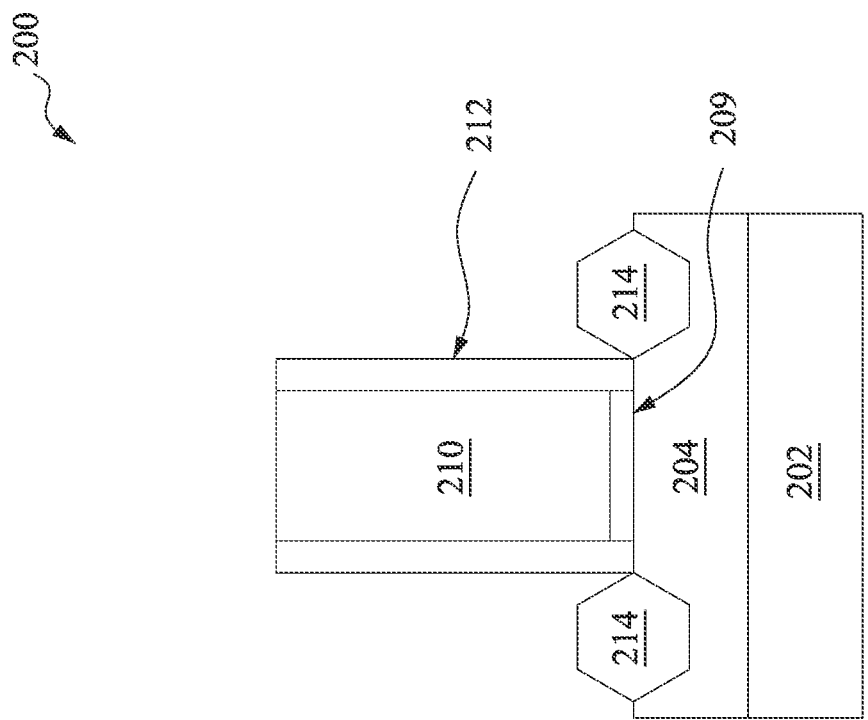

Referring to FIG. 4, method 100 at operation 104 forms the epitaxial S/D features 214 in the fin 204 and adjacent to the dummy gate stack 210. The epitaxial S/D features 214 may be suitable for forming a p-type FinFET device (e.g., including a p-type epitaxial material) or alternatively, an n-type FinFET device (e.g., including an n-type epitaxial material). The p-type epitaxial material may include one or more epitaxial layers of silicon germanium (epi SiGe), where the silicon germanium is doped with a p-type dopant such as boron, germanium, indium, and/or other p-type dopants. The n-type epitaxial material may include one or more epitaxial layers of silicon (epi Si) or silicon carbon (epi SiC), where the silicon or silicon carbon is doped with an n-type dopant such as arsenic, phosphorus, and/or other n-type dopants. In some embodiments, one or more epitaxy processes are performed to grow an epitaxial material in an S/D recess (not depicted) formed by a suitable etching process in the fin 204. The epitaxy process may include CVD techniques (for example, vapor-phase epitaxy (VPE), ultra-high vacuum CVD (UHV-CVD), low-pressure CVD (LP-CVD), and/or plasma-enhanced CVD (PE-CVD)), molecular beam epitaxy, other suitable SEG processes, or combinations thereof. The epitaxy process may use gaseous and/or liquid precursors, which interact with the composition of the underlying substrate. In some embodiments, the epitaxial material is doped in-situ by adding a dopant to a source material during the epitaxial growth process. In some embodiments, the epitaxial material is doped by an ion implantation process after performing a deposition process. In some embodiments, an annealing process is subsequently performed to activate the dopants in the epitaxial S/D features 214.

Thereafter, method 100 at operation 106 subsequently removes the dummy gate stack 210 to form a gate trench 220 between the gate spacers 212. Before removing the dummy gate stack 210, referring to FIG. 5, method 100 forms an interlayer dielectric (ILD) layer 218 over the epitaxial S/D features 214 by CVD, FCVD, SOG, other suitable methods, or combinations thereof. The ILD layer 218 may include silicon oxide, a low-k dielectric material, TEOS, doped silicon oxide (e.g., BPSG, FSG, PSG, BSG, etc.), other suitable dielectric materials, or combinations thereof. Method 100 may optionally form an etch-stop layer (ESL) 216 over the epitaxial S/D features 214 before forming the ILD layer 218. The ESL 216 may include silicon nitride, silicon oxynitride, oxygen- or carbon-doped silicon nitride, other suitable materials, or combinations thereof, and may be formed by CVD, physical vapor deposition (PVD), atomic layer deposition (ALD), other suitable methods, or combinations thereof. Thereafter, method 100 may planarize the ILD layer 218 in one or more CMP processes to expose a top surface of the dummy gate stack 210.

In the present embodiments, referring to FIGS. 1B and 6-9, method 300 is implemented to remove the dummy gate stack 210 in a series of etching processes. At operation 302, referring to FIG. 6, method 300 implements an etching process 402 to remove a top portion of the dummy gate stack 210, thereby forming the gate trench 220. In the present embodiments, the etching process 402 removes the top portion of the dummy gate stack 210 without removing, or substantially removing the gate spacers 212, the ESL 216, and the ILD layer 218. In some embodiments, the etching process 402 accommodates subsequent processing steps (e.g., trimming process 404) by creating open space for etchant(s) to interact with the gate spacers 212, the ESL 216, and/or the ILD layer 218 (e.g., removal by chemical reaction and/or by physical bombardment).

The etching process 402 may be any suitable etching process configured to anisotropically and selectively remove the top portion of the dummy gate stack 210. In the present disclosure, the term "anisotropic" generally refers to an etching process being substantially unidirectional. In the present embodiments, being "anisotropic" refers to the direction of an etching process being substantially along a vertical height of the dummy gate stack 210, i.e., along the Z axis as depicted herein. In the present embodiments, a suitable etchant implemented during the etching process 402 includes, for example, a chlorine-containing gas (e.g., $Cl_2$, $SiCl_4$, $BCl_3$, other chlorine-containing gas, or combinations thereof), a fluorine-containing etchant (e.g., $CF_4$, $CHF_3$, $CH_3F$, $CH_2F_2$, $C_4F_8$, $C_4F_6$, other fluorine-containing gas, or combinations thereof), a bromine-containing etchant (e.g., HBr), an oxygen-containing etchant (e.g., $O_2$), a hydrogen-containing etchant (e.g., $H_2$), an inert gas (e.g., He, Ne, Ar, Kr, Xe, Rn, or combinations thereof), other suitable etchants, or combinations thereof. In the present embodiments, the etchant utilized for the etching process 402 chemically reacts with the polysilicon material to remove (by oxidation, for example) the top portion of the dummy gate stack 210. In some embodiments, etching parameters such as power and/or bias are controlled to ensure that the etching direction remains substantially anisotropic.

In some embodiments, the top portion removed by the etching process 402 is defined by a height H1, which is less than a total height H of the dummy gate stack 210. In other words, the present embodiments provide that the etching process 402 is tuned to partially etch the dummy gate stack 210 without removing it entirely. In some embodiments, the height H1 is controlled by the duration of the etching process. In some examples, a ratio of H1 to H may be about 1:5 to about 1:2 or about 1:4 to about 1:3, and H1 may be about 80 Angstroms. In some instances, if the ratio of H1 to H is less than about 1:5, the etching process 402 may not be effective in creating space for the subsequent trimming process 404. On the other hand, if the ratio of H1 to H is greater than about 1:2, subsequent etching processes, including the trimming process 404 and the etching process 406, may inadvertently damage the underlying fin 204.

Figures 7, 8:
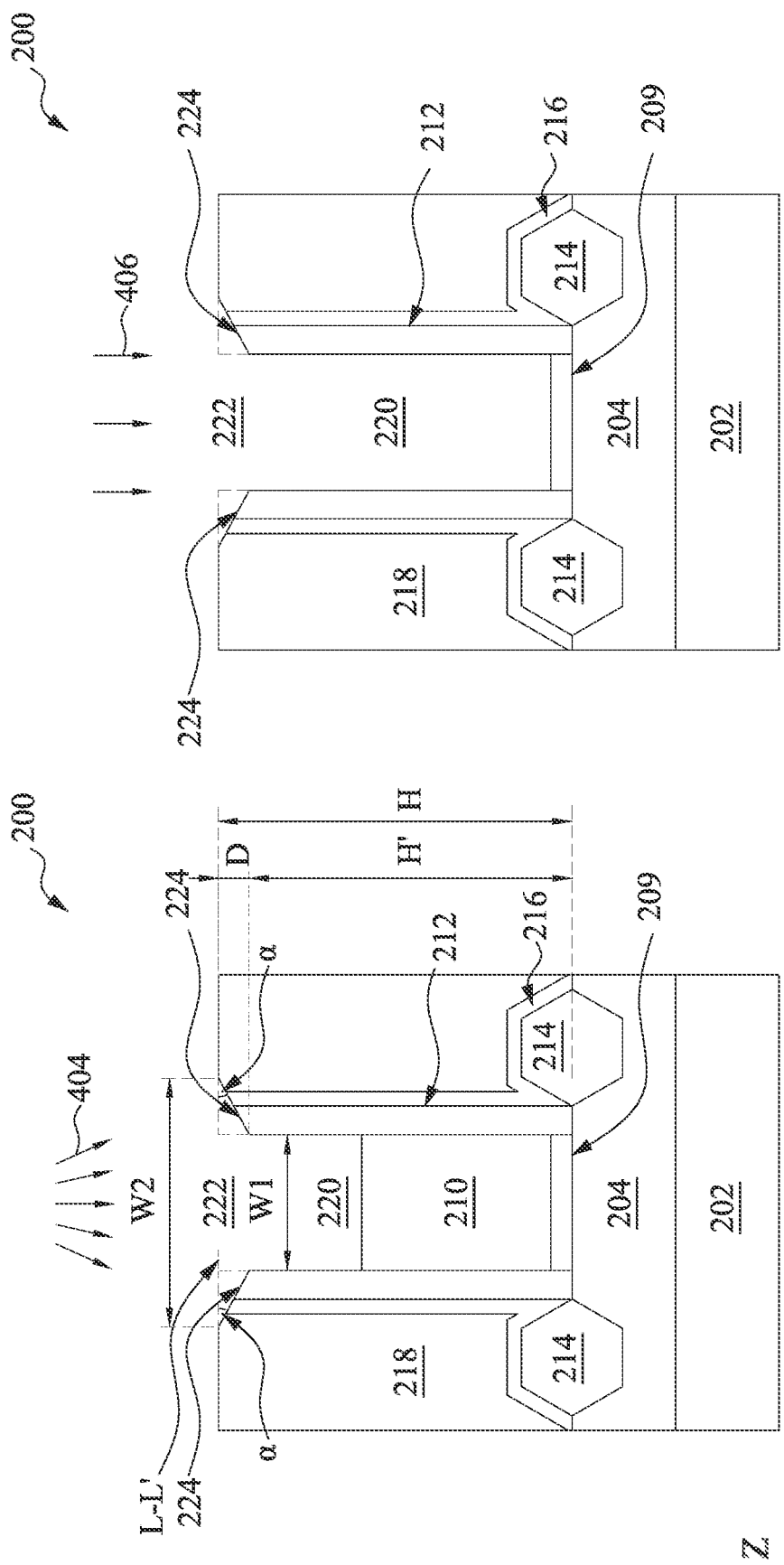

Thereafter, referring to FIG. 7, method 300 at operation 304 implements a trimming process 404 to form a funnel-like opening 222 in the gate trench 220. In the present embodiments, the trimming process 404 is an isotropic etching process configured to remove top portions of the gate spacers 212 (and the ESL 216), thereby laterally (i.e., along the X axis) expanding the gate trench 220 at its top opening. In some embodiments, the trimming process 404 is tuned to remove the top portions of the gate spacers 212 (and the ESL 216) without substantially removing the remaining portion of the dummy gate stack 210. In other words, the height H1 of the gate trench 220 does not substantially change after implementing the trimming process 404. In some embodiments, the trimming process 404 also removes a portion of the ILD later 218 disposed near the opening of the gate trench 220.

The trimming process 404 differs from the etching process 402 in a number of aspects. For example, the term "isotropic," as opposed to "anisotropic" discussed above with respect to the etching process 402, generally refers to an etching process being substantially multi-directional. In the present embodiments, compared to the etching process 402, the isotropic nature of the trimming process 404 allows top portions of the gate spacers 212 exposed by the gate trench 220 to be etched more than a top surface of the remaining portion of the dummy gate stack 210. Additionally, in order to minimize the removal of the remaining portion of the dummy gate stack 210 by the trimming process 404, method 300 implements a dry etchant that includes one or more inert gas such as, for example, He, Ne, Ar, Kr, Xe, Rn, or combinations thereof. In some embodiments, one or more noble gas constitutes at least about 30% of the composition of the dry etchant implemented at the trimming process 404. In some embodiments, one or more noble gas constitutes about 100% of the composition of the dry etchant, i.e., the dry etchant is free, or substantially free, of any non-noble gas. In the present embodiments, the dry etchant does not chemically react, or does not substantially react, with the composition of the dummy gate stack 210; rather, the dry etchant provides high-energy ions to remove portions of the gate spacers 212 by particle bombardment. As such, the dry etchant utilized for the trimming process 404 is different from that implemented for the etching process 402 (and the etching process 406 as discussed in detail below), which is configured to intentionally remove the dummy gate stack 210. In some embodiments, due to the loading of the etchant being more concentrated near the opening of the gate trench 220, the trimming process 404 removes more of the gate spacers 212 than the ESL 216 (and the ILD layer 218), thereby forming the funnel-like opening 222.

Still referring to FIG. 7, the funnel-like opening 222 may be characterized by a top width W2 and a bottom width W1, which is less than the top width W2. The top width W2 generally defines the lateral extent (i.e., a distance along the X-axis) of the etching resulted from the trimming process 404, and the bottom width W2 defines a width of the gate trench 220 between the gate spacers 212. Due to the loading effect of the dry etchant, the trimming process 404 results in a top surface 224 of the trimmed gate spacers 212 and the ESL 216. In some embodiments, as depicted herein, the top surface 224 forms an angle $\alpha$ with a horizontal reference line LL' (e.g., a reference line substantially parallel to the X-axis). In other words, the top surface 224 tilts downward toward the fin 204 at the angle $\alpha$. In the present embodiments, the angle $\alpha$ is an acute angle and is negative due to the downward slant of the top surface 224 with respect to the horizontal reference line LL'. In some embodiments, the angle $\alpha$ is less than about 20°. For example, the angle $\alpha$ may be less than about 10°. In the present embodiments, the angle $\alpha$ is adjusted by controlling various parameters of the trimming process 404 including, for example, etching bias, etching power, etching time, other suitable parameters, or combinations thereof. For example, increasing one or more of the aforementioned factors generally increase the angle $\alpha$.

In some embodiments, the degree of slant of the funnel-like opening 222 is generally proportional to the magnitude of the angle $\alpha$, i.e., the greater the angle $\alpha$, the steeper the top surface 224. Additionally, as depicted in FIG. 7, a vertical drop of the funnel-like opening 222 may be defined by a distance D, which is also proportional to the angle $\alpha$ by trigonometric relations, i.e., the greater the angle $\alpha$, the greater the distance D. Accordingly, increasing the angle $\alpha$ reduces a final gate height H' of the subsequently-formed metal gate stack, which is a difference between the total height H of the dummy gate stack 210 and the distance D. As such, although the present embodiments do not limit the angle $\alpha$ to specific values, the magnitude of the angle $\alpha$ may be determined based on a number of factors including, for example, a desired degree of the steepness of the funnel-like opening and a desired final gate height of the metal gate stack.

Referring to FIG. 8, method 300 at operation 306 subsequently implements an etching process 406 to remove the remainder of the dummy gate stack 210, thereby extending the gate trench 220 downward along the Z axis. In some embodiments, as depicted herein, the etching process 406 completely removes the dummy gate stack 210 to expose the interfacial layer 209. In some embodiments, the etching process 406 is configured to anisotropically remove the remainder of the dummy gate stack 210 in a manner similar to the etching process 402. For example, the etching process 406 may implement a dry etching process utilizing a dry etchant similar to that of the etching process 402 including a chlorine-containing gas (e.g., $Cl_2$, $SiCl_4$, $BCl_3$, other chlorine-containing gas, or combinations thereof), a fluorine-containing etchant (e.g., $CF_4$, $CHF_3$, $CH_3F$, $CH_2F_2$, $C_4F_8$, $C_4F_6$, other fluorine-containing gas, or combinations thereof), a bromine-containing etchant (e.g., HBr), an oxygen-containing etchant (e.g., $O_2$), a hydrogen-containing etchant (e.g., $H_2$), an inert gas (e.g., He, Ne, Ar, Kr, Xe, Rn, or combinations thereof), other suitable etchants, or combinations thereof. In some embodiments, the etching process 406 is implemented using similar etching parameters as the etching process 402. In some embodiments, the etching process 406 is configured to remove a greater amount of the dummy gate stack 210, defined by a height that is the difference between H and H1 discussed in detail above. To that end, the etching process 406 may implement different etching parameters (e.g., etching bias, etching power, etching time, composition of the etchant, other suitable parameters, or combinations thereof) from those of the etching process 402. For example, the etching process 406 may implement a higher etching bias and/or a higher etching power than the etching process 402. Additionally or alternatively, the etching process 406 may implement a wet etching process utilizing a suitable wet etchant, such as $H_2O_2$, $NH_4OH$, HCl, $H_2O$, other suitable wet etchants, or combinations thereof. In some embodiments, the wet etching process is configured to provide enhanced etching selectivity between the composition (i.e., polysilicon) of the dummy gate stack 210 and the surrounding components.

Figure 9:
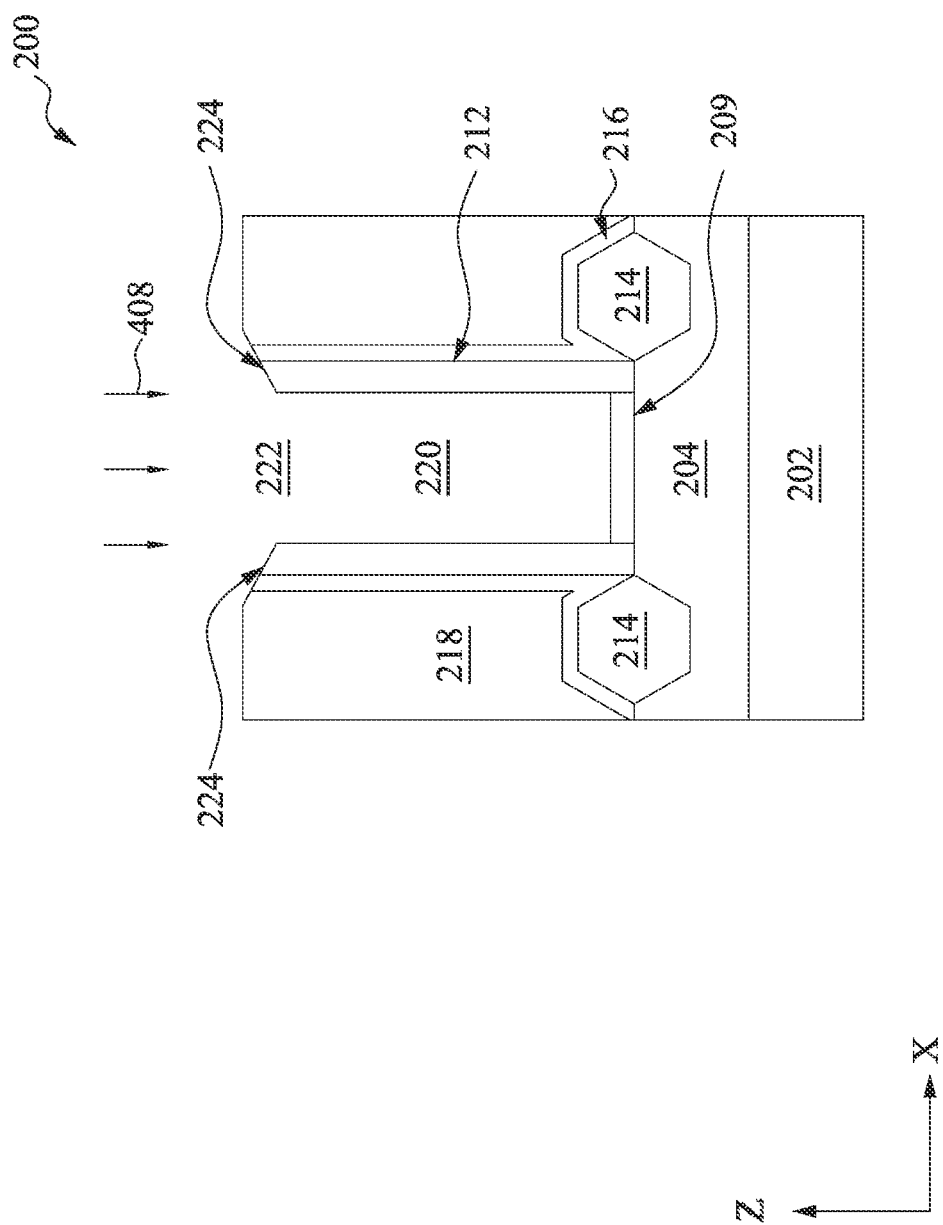

Thereafter, referring to FIG. 9, method 300 at operation 308 performs a cleaning process 408 to the gate trench 220, thereby removing any etching by-products remaining in the gate trench 220. In the present embodiments, the cleaning process 408 is a wet etching process configured to remove etching by-products resulted from the etching process 402, the trimming process 404, and/or the etching process 406. In some embodiments, the cleaning process 408 implements a wet etchant, such as $H_2O_2$, $NH_4OH$, HCl, $H_2O$, other suitable wet etchants, or combinations thereof.

Figure 11:
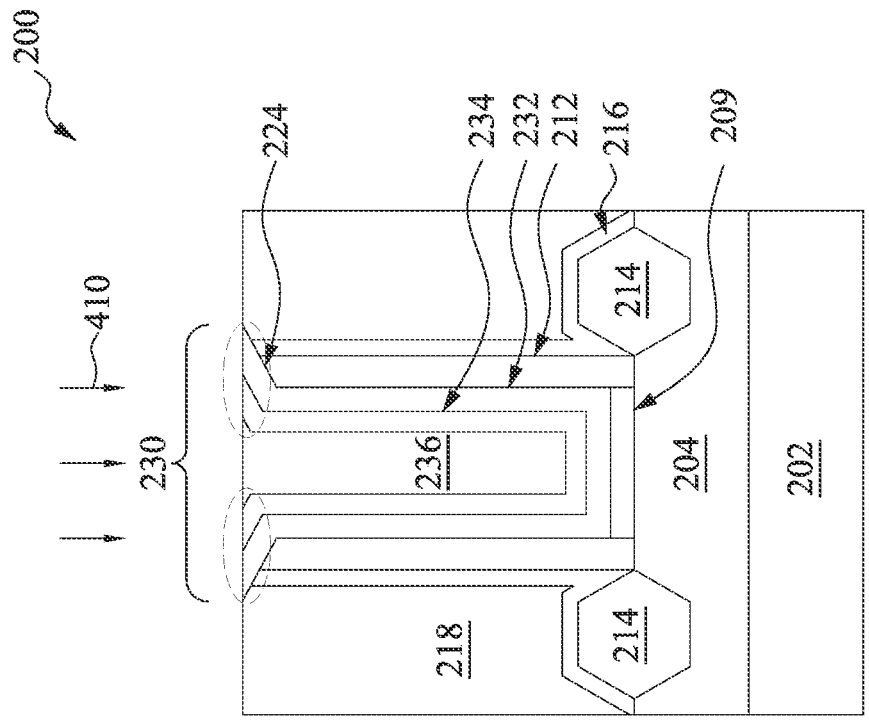

Now referring back to FIG. 1A and to FIGS. 10 and 11, method 100 at operation 108 subsequently forms a metal gate stack 230 in the gate trench 220. In the present embodiments, the metal gate stack 230 includes at least a high-k dielectric layer 232, where "high-k" denotes a dielectric constant greater than about that of silicon dioxide (about 3.9), and a metal gate electrode including a work function metal layer 234 and a bulk conductive layer 236 disposed over the high-k dielectric layer 232. As a result, the metal gate stack 230 is hereafter referred to as the high-k metal gate structure (HKMG) 230.

Referring to FIG. 10, the high-k dielectric layer 232 may include any suitable high-k dielectric material, such as hafnium oxide, lanthanum oxide, other suitable materials, or combinations thereof. The work function metal layer 234 may include any suitable metal-containing material, such as TiN, TaN, Ru, Mo, Al, WN, $ZrSi_2$, $MoSi_2$, $TaSi_2$, $NiSi_2$, Ti, Ag, TaAl, TaAlC, TiAlN, TaC, TaCN, TaSiN, Mn, Zr, other suitable work function materials, or combinations thereof. The work function metal layer 234 may include a p-type or of an n-type material, depending upon specific design requirements. Though not depicted, additional work function metal layers of similar and/or different type may be formed over the work function metal layer 234. The bulk conductive layer 236 may include any suitable metal, such as Cu, W, Al, Co, Ru, other suitable metals, or combinations thereof. The HKMG 230 may further include other material layers (not depicted), such as a capping layer, a barrier layer, other suitable layers, or combinations thereof. Various layers of the HKMG 230 may be deposited by any suitable method, such as ALD, CVD, PVD, plating, other suitable methods, or combinations thereof.

Still referring to FIG. 10, the high-k dielectric layer 232, the work function metal layer 234, and the bulk conductive layer 236 (and other material layers not depicted herein) are formed in the gate trench 220 as well as over the top surface of the ILD layer 218 and the top surface 224 of the gate spacers 212 (and the ESL 216). The processes of forming at least the high-k dielectric layer 232 and the work function metal layer 234 may cause matter to accumulate on the top portions of the gate spacers 212, thereby narrowing the opening of the gate trench 220 and inadvertently restricting additional material layer to be deposited efficiently in the gate trench 220. Consequently, restricted opening may lead to incomplete deposition of the bulk conductive layer 236, causing defects such as air gap to be formed in the bulk conductive layer and thus compromising performance of the resulting device. This shortcoming may be particularly prevalent when the top surface 224 of the gate spacers 212 is substantially leveled with or slanted upward (as depicted in dotted lines) from the horizontal reference line LL', such that the angle α becomes about 0 or positive, i.e., $\alpha \geq 0$. In such cases, a maximum width afforded by the opening of the gate trench 220 is the width W1 of the gate trench 220. As such, any matter accumulated at or near the opening of the gate trench will further narrow the width W2, thereby decreasing the space available for the deposition of the bulk conductive layer 236. In the present embodiments, however, the trimming process 404 implemented at operation 304 creates the funnel-like opening 222 (see FIGS. 7-9) defined by the top width W2 that is greater than the width W1 of the gate trench 220. In other words, the trimming process 404 laterally extends the opening of the gate trench 220 in order to accommodate multiple material layers being deposited into the gate trench 220 without significantly restricting the space available for the formation of the bulk conductive layer 236.

Subsequently, referring to FIG. 11, method 100 implements one or more CMP process 410 to remove any material layers formed on the top surface of the ILD layer 218, thereby completing the formation of the HKMG 230. As a result of the intentional trimming of the gate spacers 212 (and the ESL 216), portions (indicated by the dotted circles) of the high-k dielectric layer 232 and the work function metal layer 234 formed on the top surface 224 (i.e., the top surfaces of the gate spacers 212 and the ESL 216) are retained after performing the CMP process 410. In other words, the high-k dielectric layer 232 and the work function metal layer laterally extend away from the bulk conductive layer 236.

Figures 12A, 12B:
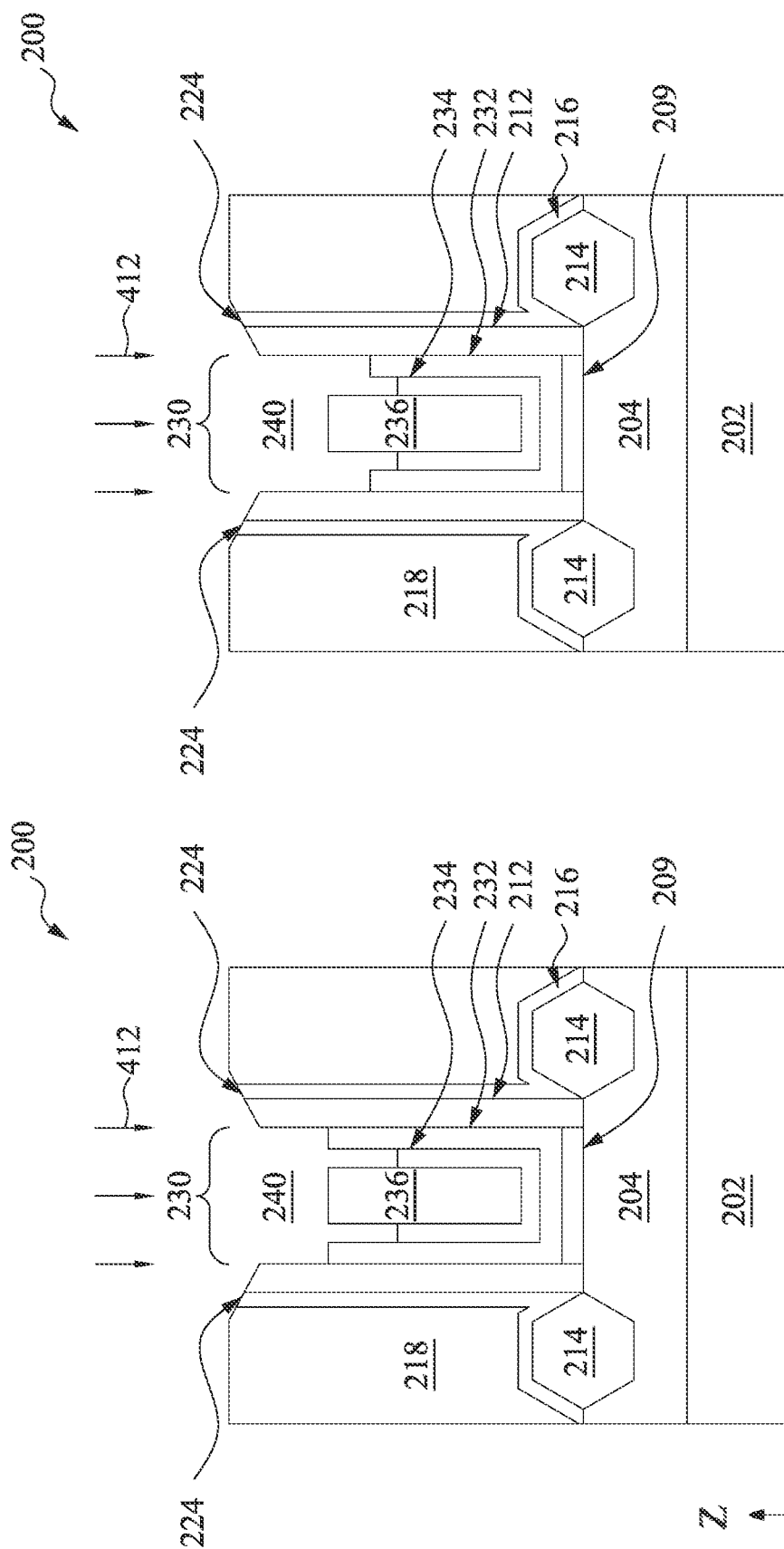

Now referring to FIGS. 12A and 12B, method 100 at operation 110 removes a top portion of the HKMG 230 in an etching process 412 to form a gate recess 240. In the present embodiments, the etching process 412 implements an etchant configured to selectively remove portions of the high-k dielectric layer 232, the work function metal layer 234, and the bulk conductive layer 236 without removing, or substantially removing, the gate spacers 212, the ESL 216, and the ILD layer 218. In some embodiments, the etching process 412 removes the high-k dielectric layer 232, the work function metal layer 234, and the bulk conductive layer 236 at different rates, resulting in the gate recess 240 having an uneven bottom surface. In the present embodiments, the etching process 412 generally removes work function metal layer 234 at a higher rate than the high-k dielectric layer 232 and/or the bulk conductive layer 236. As a result, the bottommost portions of the gate recess 240 are disposed between the high-k dielectric layer 232 and the bulk conductive layer 236. In one embodiment, referring to FIG. 12A, the etching process 412 is configured to remove the high-k dielectric layer 232 at a similar rate as the bulk conductive layer 236, resulting in a top surface of the high-k dielectric layer 232 to be substantially planar with a top surface of the bulk conductive layer 236. In another embodiment, referring to FIG. 12B, the etching process 412 is configured to remove the high-k dielectric layer 232 at a higher rate than the bulk conductive layer 236, resulting in the top surface of the high-k dielectric layer 232 being lower than the top surface of the bulk conductive layer 236. While both configurations are applicable to the present embodiments, subsequent operations of method 100 are discussed with reference to the configuration depicted in FIG. 12A as merely an example.

Figure 14:
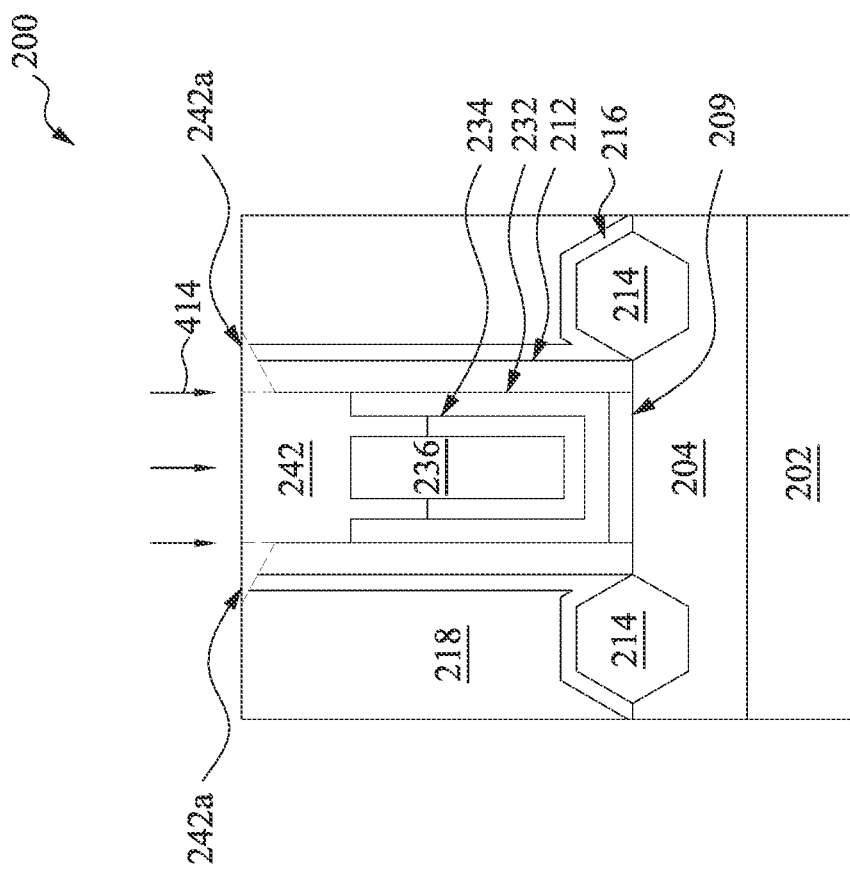
Figure 13:
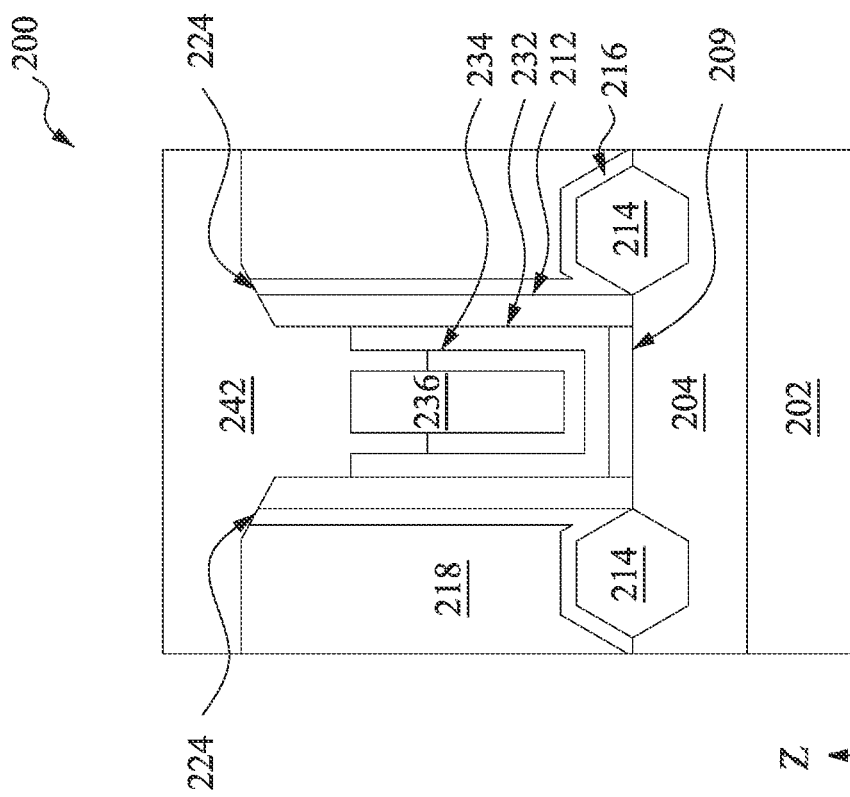

Now referring to FIGS. 13 and 14, method 100 at operation 112 forms a dielectric layer 242 in the gate recess 240. Referring to FIG. 13, method 100 forms the dielectric layer 242 in the gate recess 240 and over the top surface of the ILD layer 218. The dielectric layer 242 may be deposited in the gate recess 240 by any suitable method, such as CVD, FCVD, ALD, PVD, other suitable methods, or combinations thereof. The dielectric layer 242 may include silicon oxide, silicon nitride, silicon carbide, silicon carbonitride, silicon oxynitride, silicon oxycarbonitride, aluminum oxide, aluminum nitride, aluminum oxynitride, zirconium oxide, zirconium nitride, zirconium aluminum oxide, hafnium oxide, other suitable materials, or combinations thereof. In the present embodiments, the dielectric layer 242 exhibits etching selectivity relative to the ILD layer 218, such that additional processing steps may be performed to the ILD layer 218 without substantially affecting the HKMG 230. For example, the dielectric layer 242 may be configured to accommodate the self-aligned formation of an S/D contact (not depicted) in the ILD layer 218 to electrically couple with the epitaxial S/D features 214.

Referring to FIG. 14, method 100 subsequently planarizes the dielectric layer 242 in one or more CMP process 414 to expose the top surface of the ILD layer 218, resulting in top portions 242a (indicated by dotted lines) of the dielectric layer 242 being formed on the top surface 224. Due to the downward slant of the top surface 224, the top portions 242a of the dielectric layer 242 have a substantially triangular configuration that laterally extends beyond the outermost sidewalls of the dielectric layer 242 defined by the gate spacers 212. In some embodiments, though not depicted, method 100 may proceed to forming S/D contact(s) in the ILD layer 218 to couple the epitaxial S/D features 214 with subsequently-formed interconnect features, such as vias.

Referring to FIGS. 15-18B, method 100 at operation 114 forms a gate contact 262 to couple the HKMG 230 with a subsequently-formed interconnect feature, such as a via. Referring to FIG. 15, method 100 first forms an ILD layer 250 over the dielectric layer 242, where the ILD layer 250 may be similar to the ILD layer 218 in terms of composition and method of fabrication, which are discussed in detail above. Referring to FIG. 16, method 100 forms an opening 252 in the ILD layer 250, where the opening 252 is configured to expose the HKMG 230 disposed under the dielectric layer 242. The opening 252 may be formed by performing a series of patterning and etching processes. For example, a masking element (not depicted) including a photoresist layer may be formed over the ILD layer 250, where the masking element is exposed to radiation through a lithography mask and subsequently developed to form a pattern corresponding to the opening 252 in the masking element. Portions of the ILD layer 250 exposed by the patterned masking element are then removed by a suitable etching process, thereby forming the opening 252. Subsequently, method 100 performs an etching process 416 to remove the exposed portions of the dielectric layer 242 using the patterned ILD layer 250 as an etch mask. In the present embodiments, the outermost sidewalls the opening 252 are defined by the gate spacers 212, such that the high-k dielectric layer 232 is fully exposed. As a result, the top portions 242a of the dielectric layer 242 remain in the device 200 as they are disposed outside the opening 252.

Figure 17:
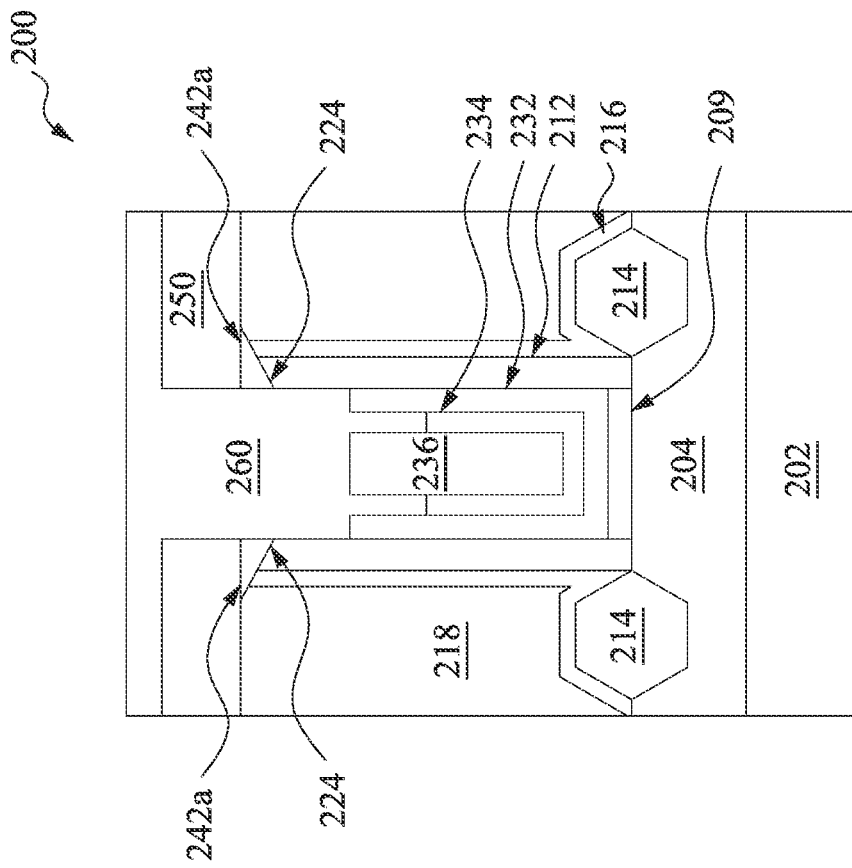
Figures 18A, 18B:
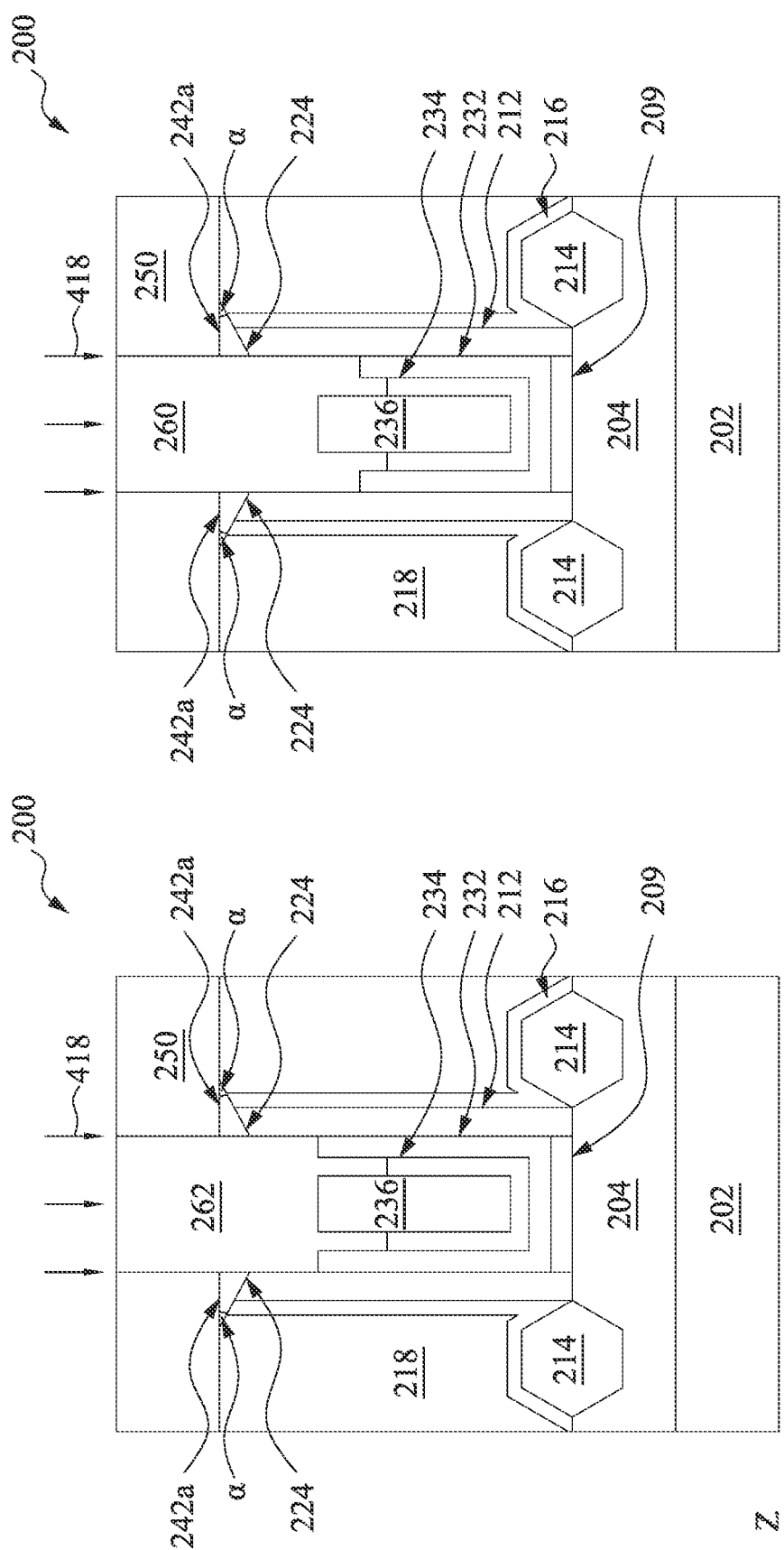

Now referring to FIG. 17, method 100 deposits a conductive layer 260 in the opening 252 and over the ILD layer 250. The conductive layer 260 may include any suitable metal, such as Cu, W, Al, Co, Ru, other suitable metals, or combinations thereof, and may be formed by any suitable method, such as CVD, PVD, plating, other suitable methods, or combinations thereof. Subsequently, referring to FIG. 18A, method 100 performs one or more CMP process 418 to planarize the conductive layer 260, thereby forming the gate contact 262. In the present embodiments, bottom portions of the gate contact 262 extend to contact sidewalls of the high-k dielectric layer 232 and the bulk conductive layer 236. Furthermore, as provided herein, portions of the sidewalls of the gate contact 262 contact the ILD layer 250, the dielectric layer 242 (i.e., the top portions 242a), and the gate spacers 212. For purposes of comparison, FIG. 18B depicts the device 200 in which the top surface of the recessed high-k dielectric layer 232 is lower than the top surface of the recessed bulk conductive layer 236, an embodiment corresponding to that depicted in FIG. 12B.

Thereafter, method 100 at operation 116 may perform additional processing steps to the device 200. For example, method 100 may form additional features such as, for example, vertical interconnect features (e.g., vias), horizontal interconnect features (e.g., conductive lines), dielectric layers (e.g., intermetal dielectric layers), other suitable features, or combinations thereof over the device 200 to complete the fabrication process.

Although not intended to be limiting, one or more embodiments of the present disclosure provide many benefits to a semiconductor device and the formation thereof. For example, the present disclosure provides methods of removing a dummy gate stack to form a gate trench, followed by forming a metal gate stack therein with improved gap-filling effect. In some embodiments, a trimming process is implemented when removing the dummy gate stack, during which portions of gate spacers disposed on sidewalls of the dummy gate stack are intentionally removed to form a downward, funnel-like opening to the gate trench. In some embodiments, an etchant implemented for the trimming process is chemically inert toward the dummy gate stack, such that the gate spacers are selectively removed. In some embodiments, such etchant substantially includes an inert gas. The funnel-like opening laterally expands the opening of the gate trench, reducing inadvertent matter pile-up and thus allowing more efficient gap-filling when forming various material layers of the metal gate stack. Embodiments of the disclosed methods can be readily integrated into existing processes and technologies for manufacturing FETs, such as planar FETs, FinFETs, GAA FETs, and/or other suitable FETs.

In one aspect, the present embodiments provide a method that includes forming a dummy gate stack over a fin protruding from a semiconductor substrate, forming gate spacers on sidewalls of the dummy gate stack, forming S/D features over portions of the fin, forming a gate trench between the gate spacers, and forming a metal gate structure in the gate trench. In the present embodiments, forming the gate trench includes trimming top portions of the gate spacers to form a funnel-like opening in the gate trench.

In another aspect, the present embodiments provide a semiconductor structure that includes a semiconductor fin protruding from a substrate, a metal gate structure disposed over the semiconductor fin, gate spacers disposed on sidewalls of the metal gate structure, where a top surface of each gate spacer is angled toward the semiconductor fin, a dielectric layer disposed over the top surface of each gate spacer, and a conductive feature disposed between the gate spacers to contact the metal gate structure, where sidewalls of the conductive feature contact the dielectric layer. In some embodiments, the metal gate structure includes a gate dielectric layer, a work function metal layer disposed over the gate dielectric layer, and a bulk conductive layer disposed over the work function metal layer.

In yet another aspect, the present embodiments provide a method that includes forming a placeholder gate stack over a semiconductor substrate, where the placeholder gate stack includes spacers disposed on its sidewalls, replacing the placeholder gate stack with a metal gate stack, and forming a gate contact over the metal gate stack. In the present embodiments, replacing the placeholder gate stack includes removing a top portion of the placeholder gate stack in a first etching process, trimming top portions of the spacers at an angle in a second etching process, resulting in the spacers having an angled top surface, removing a bottom portion of the placeholder gate stack in a third etching process, thereby forming a gate trench between the trimmed spacers, and forming the metal gate stack in the gate trench.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a dummy gate stack over a fin protruding from a semiconductor substrate;
   forming gate spacers on sidewalls of the dummy gate stack;
   forming source/drain (S/D) features over portions of the fin;
   forming a gate trench between the gate spacers, wherein forming the gate trench includes removing the dummy gate stack to expose the gate spacers in the gate trench and trimming a top portion of the exposed gate spacers to form slanted top surfaces in the trimmed gate spacers, resulting in a funnel-like opening in the gate trench; and
   forming a metal gate structure in the gate trench and over the slanted top surfaces of the trimmed gate spacers.

2. The method of claim 1, wherein forming the gate trench includes:
   performing a first etching process to remove a top portion of the dummy gate stack;
   performing a trimming process to remove the top portion of the gate spacers, thereby forming a slanted top surface in the gate spacers; and
   performing a second etching process to remove a remaining portion of the dummy gate stack, thereby forming the gate trench between the trimmed gate spacers.

3. The method of claim 2, wherein the trimming process removes the top portion of the gate spacers without substantially removing the dummy gate stack.

4. The method of claim 3, wherein the trimming process implements an etchant that is chemically inert toward a composition of the dummy gate stack.

5. The method of claim 2, wherein the first etching process and the second etching process are implemented anisotropically, and wherein the second etching process is implemented isotropically.

6. The method of claim 2, wherein the top portion of the dummy gate stack removed by the first etching process has a first height and the remaining portion of the dummy gate stack removed by the second etching process has a second height, and wherein the first height is less than the second height.

7. The method of claim 1, further comprising:
   removing a top portion of the metal gate structure to form a gate recess; and
   forming a dielectric layer in the gate recess, wherein a top portion of the dielectric layer extend laterally beyond sidewalls of the metal gate structure.

8. The method of claim 7, further comprising:
   removing a portion of the dielectric layer to form a contact opening that exposes the metal gate structure; and
   forming a gate contact in the contact opening.

9. The method of claim 7, wherein forming the metal gate structure includes forming a high-k gate dielectric layer over the gate spacers, forming a work function metal layer over the high-k gate dielectric layer, and forming a bulk conductive layer over the work function metal layer, and wherein removing the top portion of the metal gate structure selectively removes the work function metal layer with respect to the bulk conductive layer and the high-k gate dielectric layer.

10. A method, comprising:
    forming a placeholder gate stack over a semiconductor substrate, wherein the placeholder gate stack includes spacers disposed on its sidewalls;
    replacing the placeholder gate stack with a metal gate stack, wherein replacing the placeholder gate stack includes:
       removing a top portion of the placeholder gate stack in a first etching process;
       trimming top portions of the spacers at an angle in a second etching process, resulting in the spacers having angled top surfaces;
       removing a bottom portion of the placeholder gate stack in a third etching process, thereby forming a gate trench between the trimmed spacers; and
       forming the metal gate stack in the gate trench; and
    forming a gate contact over the metal gate stack.

11. The method of claim 10, wherein the second etching process implements an etchant that consists one or more noble gas.

12. The method of claim 10, wherein the third etching process is implemented with a wet etchant.

13. The method of claim 10, wherein trimming the top portions of the spacers forms a funnel-like opening in the gate trench.

14. The method of claim 10, further comprising, before forming the gate contact:
    recessing the metal gate stack; and
    forming a dielectric cap over the recessed metal gate stack, such that top portions of the dielectric cap are formed on the angled top surfaces of the trimmed spacers.

15. The method of claim 14, wherein forming the gate contact includes:
    removing a portion of the dielectric cap to form an opening; and
    forming the gate contact in the opening, such that the gate contact directly contact sidewalls of the dielectric cap.

16. A method, comprising:
    forming a placeholder gate over a semiconductor fin;
    forming gate spacers along sidewalls of the placeholder gate;
    forming source/drain (S/D) features; and
    forming a metal gate stack in place of the placeholder gate and adjacent to the S/D features, wherein forming the metal gate stack includes:
       removing a top portion of the placeholder gate to form a gate trench between the gate spacers;
       trimming the gate spacers to form a slanted opening in the gate trench;
       removing a remaining portion of the placeholder gate to extend the gate trench between the trimmed gate spacers; and
       forming the metal gate stack in the extended gate trench.

17. The method of claim 16, wherein trimming the gate spacers is implemented with an etchant that is chemically inert toward a composition of the placeholder gate.

18. The method of claim 16, wherein removing the top portion and the remaining portion of the placeholder gate includes performing anisotropic etching processes, and wherein trimming the gate spacers includes performing an isotropic etching process.

19. The method of claim 16, further comprising:
    removing a top portion of the metal gate stack to form a recess; and
    forming a dielectric layer in the recess, wherein a top portion of the dielectric layer extends laterally to directly contact a top surface of the trimmed gate spacers.

20. The method of claim 19, further comprising:
removing a portion of the dielectric layer to form an opening that exposes the metal gate stack; and
forming a gate contact in the opening to contact the metal gate stack.

\* \* \* \* \*